US012756375B2

(12) United States Patent
Wang et al.

(10) Patent No.: US 12,756,375 B2
(45) Date of Patent: Oct. 6, 2026

(54) SURFACE ACOUSTIC WAVE DEVICE

(71) Applicant: United Microelectronics Corp., Hsinchu (TW)

(72) Inventors: Chen-Hsiao Wang, Hsinchu City (TW); Kai-Kuang Ho, Hsinchu City (TW)

(73) Assignee: United Microelectronics Corp., Hsinchu (TW)

( * ) Notice: Subject to any disclaimer, the term of this patent is extended or adjusted under 35 U.S.C. 154(b) by 546 days.

(21) Appl. No.: 18/499,222

(22) Filed: Nov. 1, 2023

(65) Prior Publication Data

US 2024/0063774 A1 Feb. 22, 2024

Related U.S. Application Data

(62) Division of application No. 17/137,051, filed on Dec. 29, 2020, now Pat. No. 11,848,660.

(51) Int. Cl.

*H03H 9/10* (2006.01)
*H03H 3/08* (2006.01)
*H03H 9/02* (2006.01)
*H03H 9/25* (2006.01)

(Continued)

(52) U.S. Cl.

CPC ............ *H03H 9/1092* (2013.01); *H03H 3/08* (2013.01); *H03H 9/02937* (2013.01); *H03H 9/25* (2013.01); *H10N 30/02* (2023.02); *H10N 30/883* (2023.02); *Y10T 29/42* (2015.01); *Y10T 29/49005* (2015.01)

(58) Field of Classification Search

CPC ............... H03H 9/1071; H03H 9/1092; H03H 9/02937; H03H 9/25; H03H 3/08; Y10T 29/49005; Y10T 29/42; H10N 30/02; H10N 30/883

See application file for complete search history.

(56) References Cited

U.S. PATENT DOCUMENTS

| | | | |
|---|---|---|---|
| 6,734,601 | B2 | 5/2004 | Taga |
| 7,042,056 | B2 | 5/2006 | Koshido |
| 2004/0253801 | A1 | 12/2004 | Lin |

(Continued)

FOREIGN PATENT DOCUMENTS

| | | |
|---|---|---|
| CN | 101421591 | 4/2009 |
| CN | 106531697 | 3/2017 |

(Continued)

OTHER PUBLICATIONS

Xie Xiaowei et al., “Effect of Polyimide Coatings on SAW Resonator Based on LGS Substrates”, Piezoelectrics & Acoustooptics, Dec. 2018, submit with English abstract, pp. 1-4.

(Continued)

*Primary Examiner* — J. San Martin
(74) *Attorney, Agent, or Firm* — JCIPRNET

(57) ABSTRACT

A surface acoustic wave (SAW) device including a substrate is provided. Multiple surface acoustic wave elements are disposed on the substrate. A conductive surrounding structure includes: a wall part, disposed on the substrate and surrounding the surface acoustic wave elements; and a lateral layer part, disposed on the wall part. The lateral layer part has an opening above the surface acoustic wave elements. A cap layer covers the lateral layer part and closes the opening.

11 Claims, 3 Drawing Sheets

(51) Int. Cl.

| | |
|---|---|
| ***H10N 30/02*** | (2023.01) |
| ***H10N 30/88*** | (2023.01) |

(56) References Cited

U.S. PATENT DOCUMENTS

| | | | |
|---|---|---|---|
| 2005/0124089 | A1 | 6/2005 | Gogoi et al. |
| 2005/0214974 | A1 | 9/2005 | Field et al. |
| 2011/0018389 | A1 | 1/2011 | Fukano et al. |
| 2013/0169383 | A1 | 7/2013 | Adkisson et al. |
| 2014/0042870 | A1 | 2/2014 | Ohashi et al. |
| 2015/0166333 | A1 | 6/2015 | Li et al. |

FOREIGN PATENT DOCUMENTS

| | | | | |
|---|---|---|---|---|
| CN | 108155887 | | | 6/2018 |
| JP | 2005123561 | A | * | 5/2005 |
| JP | 2008005464 | | | 1/2008 |
| JP | 2009105528 | | | 5/2009 |
| KR | 101336150 | | | 12/2013 |

OTHER PUBLICATIONS

"Office Action of China Counterpart Application", issued on Mar. 26, 2026, pp. 1-5.

"Office Action of China Counterpart Application", issued on Oct. 18, 2024, pp. 1-12.

* cited by examiner

SURFACE ACOUSTIC WAVE DEVICE

CROSS-REFERENCE TO RELATED APPLICATION

This application is a divisional application of and claims the priority benefit of U.S. application Ser. No. 17/137,051, filed on Dec. 29, 2020, which claims the priority benefit of Chinese application serial no. 202011328874.1, filed on Nov. 24, 2020. The entirety of each of the above-mentioned patent applications is hereby incorporated by reference herein and made a part of this specification.

BACKGROUND

Technical Field

The disclosure relates to a semiconductor fabrication, and particularly to a surface acoustic wave (SAW) device and a method for fabricating the same.

Description of Related Art

A surface acoustic wave (SAW) is a sound wave travelling along the surface of an elastic material. Its amplitude usually decays exponentially with depth into the material.

A surface acoustic wave device is adapted for circuit components to provide a variety of functions, such as delay lines, filters, correlators, and DC-DC converters. Because of its light weight and dense structure, surface acoustic wave device is also applied to mobile phones.

For example, when a surface acoustic wave device is adapted to be a surface acoustic wave filter, the surface acoustic wave device and piezoelectric thin-film resonators may be used as surface acoustic wave devices for communication devices such as a cellular phone. The structure of the surface acoustic wave device includes a group of interdigital transducers, generally referred to as IDT, which may be used to convert acoustic signals into electronic signals. When explained from the perspective of broad functions, an IDT member may be a surface acoustic wave member.

Interdigital transducers are prone to oxidize in an environment of high temperature or high humidity. Therefore, there is usually a protective layer acting as a cap on the outer layer of the structure of the surface acoustic wave device. In the conventional fabricating method, the material of the cap structure is, for example, polyimide (PI). However, the moisture resistance of this PI material reduces greatly, for example, in an environment at a high temperature or high humidity, thereby causing the diminishment of the protection, which easily leads to the oxidation of the interdigital transducers.

To maintain the good function of the interdigital transducers, it is necessary to prevent moisture effectively. And the research and development of designing and fabricating a surface acoustic wave device capable of resisting moisture satisfactorily are still in need of exploration.

SUMMARY

The present disclosure provides a surface acoustic wave (SAW) device, adapted to protect the structure of an interdigital transducer, cooperate with the changes made in the fabricating process, exclude the use of polyimide materials, and/or improve the moisture resistance effectively.

In one embodiment, the present disclosure provides a surface acoustic wave device, including a substrate. A plurality of surface acoustic wave members are provided on the substrate. A conductive surrounding structure includes: a wall part, disposed on the substrate and surrounding the surface acoustic wave members; and a lateral layer part, disposed on the wall part. The lateral layer part has an opening above the surface acoustic wave members. A cap layer covers the lateral layer part and closes the opening.

In one embodiment, for the surface acoustic wave device, the cap layer is a solder layer.

In one embodiment, for the surface acoustic wave device, the cap layer is only on the top of the lateral layer part.

In one embodiment, for the surface acoustic wave device, the cap layer is a reflow solder layer to close the opening of the lateral layer part.

In one embodiment, for the surface acoustic wave device, the conductive surrounding structure is metal, and the cap layer is solder.

In one embodiment, for the surface acoustic wave device, the conductive surrounding structure includes copper and/or electroplating material.

In one embodiment, for the surface acoustic wave device, the cap layer is a molded plastic structure.

In one embodiment, for the surface acoustic wave device, the molded plastic structure also covers the outer sidewall of the conductive surrounding structure and is provided on the substrate.

In one embodiment, for the surface acoustic wave device, the cap layer is an epoxy resin cap and closes the opening of the lateral layer part.

In one embodiment, for the surface acoustic wave device, the conductive surrounding structure is metal, and the cap layer is epoxy material.

In one embodiment, for the surface acoustic wave device, the conductive surrounding structure includes copper and/or electroplating material.

In one embodiment, the present disclosure provides a surface acoustic wave device fabricating method, and the method includes: providing a substrate; forming a plurality of surface acoustic wave members on the substrate; forming a sacrificial layer to cover the surface acoustic wave members, in which the sacrificial layer includes a surrounding trench to expose the substrate and surround the surface acoustic wave members; performing an electroplating process for forming a conductive surrounding structure in the surrounding trench on the exposed surface of the substrate, in which the conductive surrounding structure includes a lateral layer part provided on the sacrificial layer, and the lateral layer part has an opening above the surface acoustic wave members; and forming a cap layer for covering the lateral layer part and closing the opening.

In one embodiment, for the surface acoustic wave device fabricating method, the conductive surrounding structure is electroplated metal.

In one embodiment, for the surface acoustic wave device fabricating method, the conductive surrounding structure includes copper and/or electroplating material.

In one embodiment, for the surface acoustic wave device fabricating method, the step of forming the cap layer includes forming a solder layer on the lateral layer part of the conductive surrounding structure, removing the sacrificial layer, and performing a reflow process on the solder layer, in which the opening of the lateral layer part is also closed.

In one embodiment, for the surface acoustic wave device fabricating method, the solder layer is electroplated on the lateral layer part of the conductive surrounding structure before performing the reflow process.

In one embodiment, for the surface acoustic wave device fabricating method, the step of forming the cap layer includes: removing the sacrificial layer; and forming a molded plastic structure, and covering the lateral layer part, for acting as the cap layer, in which the opening is closed.

In one embodiment, for the surface acoustic wave device fabricating method, the molded plastic structure also covers the outer sidewall of the conductive surrounding structure and is provided on the substrate.

In one embodiment, for the surface acoustic wave device fabricating method, the material of the molded plastic structure includes epoxy resin.

In one embodiment, for the surface acoustic wave device fabricating method, the conductive surrounding structure includes copper and/or electroplating material.

BRIEF DESCRIPTION OF THE DRAWINGS

The accompanying drawings are included to provide a further understanding of the present disclosure, and are incorporated in and constitute a part of this specification. The drawings illustrate embodiments and, together with the description, serve to explain the principles of the embodiment.

DESCRIPTION OF THE EMBODIMENTS

The present disclosure relates to a surface acoustic wave device and a fabricating method thereof, which at least exclude the use of materials with weak moisture resistance, such as polyimide, in the subsequent packaging process to protect IDT members and to prevent oxidation effectively. The surface acoustic wave device fabricating method proposed by the present disclosure allows the use of metal materials to protect the IDT member, meeting the requirements of preventing oxidation effectively.

Some embodiments are illustrated in the following to describe the present disclosure. Suitable combinations are also allowed between these embodiments.

Before bring forth the surface acoustic wave device and the fabricating method thereof, the present disclosure looks into the general structure of the surface acoustic wave device in order to at least prevent the oxidation of the IDT member of the surface acoustic wave device effectively.

Figure 1:
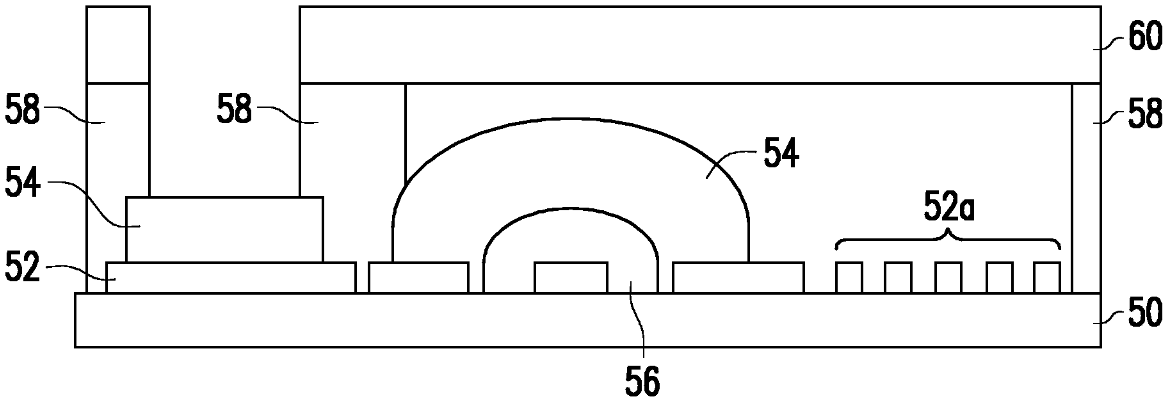
FIG. 1 is a schematic view of a structure of a surface acoustic wave device looked into according to an embodiment of the present disclosure.

FIG. 1 is a schematic view of a structure of a surface acoustic wave device looked into according to an embodiment of the present disclosure. In FIG. 1, the structure of the surface acoustic wave device is to form a metal layer 52 on a substrate 50, and the metal layer may be, for example, copper or aluminum. A sensing area 52*a* of the metal layer 52 forms a plurality of IDT cells through a defined process. In addition, to complete the overall structure of the surface acoustic wave device, further elements, for example, includes another metal layer 54 formed on the metal layer 52. Some device regions of the metal layer 52 are separated from the sensing area 52*a* by using an inter-metal dielectric (IMD) layer 56. And the inter-metal dielectric layer 56 covers the metal layer 52 that is within this region. Thereafter, surrounding walls 58 and a top layer 60 of PI material are adapted to form a cap structure to protect a plurality of IDT members in the sensing area 52*a*.

After looking into the structure of the surface acoustic wave device in the present disclosure, it is observed that the moisture resistance of the PI material may be insufficient. For example, the oxidation of the IDT members may not be effectively prevented under an environment of high humidity or high temperature. The disclosure proposes a structure for protecting an IDT member and a fabricating method thereof.

Figure 2A:
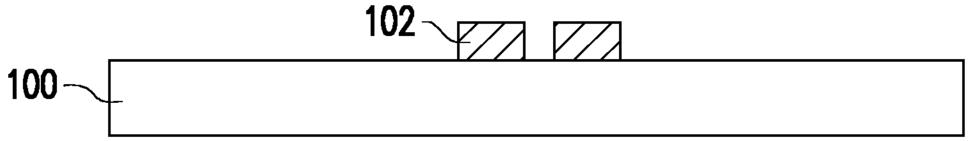
FIG. 2A to FIG. 2F are schematic cross-sectional views of a fabricating process of a surface acoustic wave device according to an embodiment of the present disclosure.

FIG. 2A to FIG. 2F are schematic cross-sectional views of a fabricating process of a surface acoustic wave device according to an embodiment of the present disclosure. In FIG. 2A, a plurality of surface acoustic wave members 102 are formed on a substrate 100 to form a sensing group to sense acoustic waves. The two surface acoustic wave members 102 in FIG. 2A are only shown as an example for illustration. In one embodiment, the surface acoustic wave member 102 may be function as, for example, an IDT member.

Figure 2B:
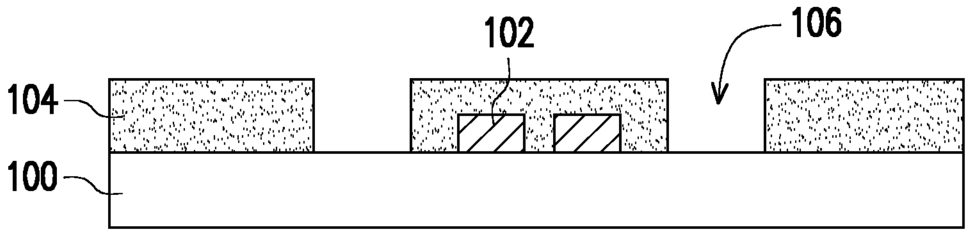

In FIG. 2B, a sacrificial layer 104 is formed on the substrate 100 and covers the surface acoustic wave members 102. The sacrificial layer 104 is, for example, a photoresist, or other materials that can be removed in a subsequent process. The sacrificial layer 104 has a surrounding trench 106, adapted to surround the protected surface acoustic wave members 102. When the sacrificial layer 104 is made of a photoresist material, it can be completed by, for example, a photolithography process, and the photoresist material may be easily completely removed then.

Figure 2C:
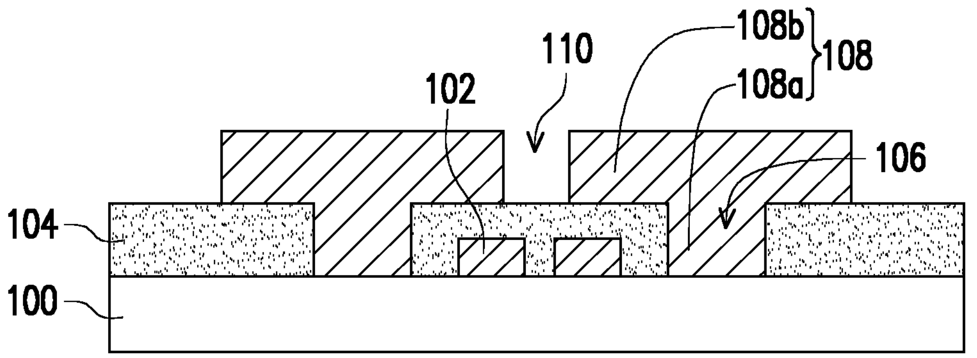

Part of the surface of the substrate 100 is exposed from the surrounding trench 106. In FIG. 2C, in one embodiment, the present disclosure performs, for example, an electroplating process to form a conductive surrounding structure 108 on the exposed surface of the substrate 100. The conductive surrounding structure 108 is copper, other adaptable metals, or electroplating materials. The material of the conductive surrounding structure 108 is not limited to the listed embodiments.

The conductive surrounding structure 108 forms a wall part 108*a* in the surrounding trench 106 of the sacrificial layer 104, and then continues to form a lateral layer part 108*b* on the top surface of the sacrificial layer 104. Although the conductive surrounding structure 108 is an integrated electroplating structure, from the perspective of structural details, the lateral layer part 108*b* is on the wall part 108*a*. The wall part 108*a* and the lateral layer part 108*b* constitute the conductive surrounding structure 108.

Here, the lateral layer part 108*b* has an opening 110 above the surface acoustic wave members 102. In other words, the lateral layer part 108*b* does not completely cover. The opening 110 can be adapted for subsequent processes to remove the sacrificial layer 104 within the zone.

Figure 2D:
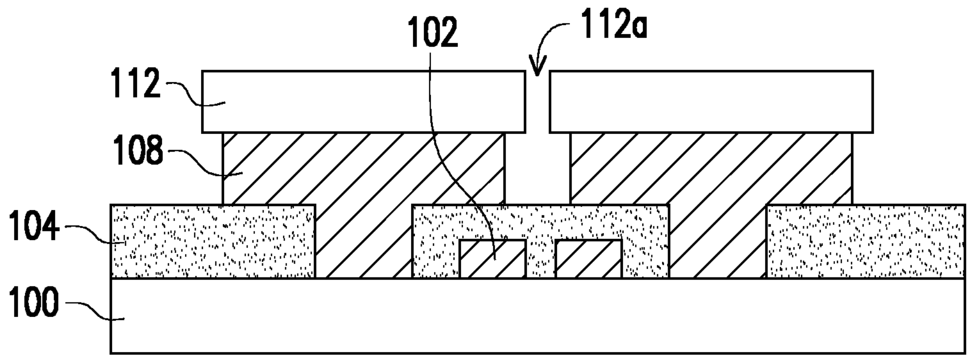

In FIG. 2D, a solder layer 112 is formed on the lateral layer part 108*b*. Solder layer(s) may continue to be electroplated on the lateral layer part 108*b* as an example, but the disclosure is not limited thereto. Here, the solder layer 112 also has an opening 112*a* communicating with the opening 110, and the sacrificial layer 104 remains exposed.

Figure 2E:
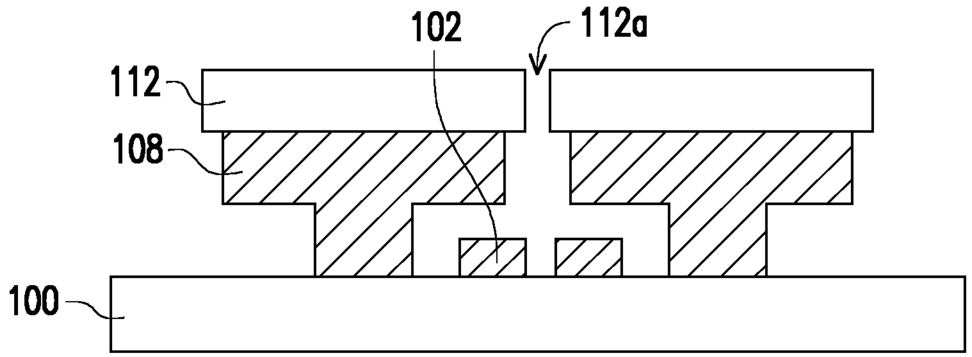

In FIG. 2E, the sacrificial layer 104 is removed by the corresponding process based on the material used for the sacrificial layer 104. For example, if the sacrificial layer 104 is a photoresist material, it is removed by using an ashing process. Since the opening 112*a* communicates with the opening 110, the sacrificial layer 104 where it covers the surface acoustic wave members 102 is also removed. This way, the surface acoustic wave member 102 may sense surface acoustic waves in the released space completely.

Figure 2F:
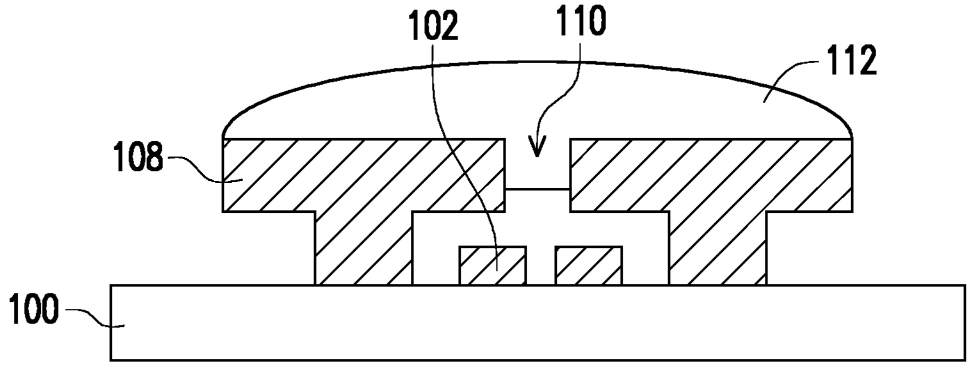

In FIG. 2F, the surface acoustic wave members 102 are in need of protection, as in dust-proof and moisture-proof. In one embodiment, a solder layer 112 may be formed by adapting the reflow process to melt then solidify the solder layer 112 to form an integrated solder layer 112, which naturally covers the opening 110 of the lateral layer part 108*b*, achieving the closing effect. The solder layer 112 is adapted as a cap structure to close the opening 110. However, the formation of the cap structure is not limited to the embodiments, such as the description of FIG. 3A to FIG. 3C recited later. The cap structure of the present disclosure is adapted to enclose the conductive surrounding structure 108, and it is limited to the illustrated embodiments.

In addition, in order to enable the solder layer 112 to close the opening 110 of the lateral layer part 108*b* after the reflow process, the sizes of the opening 110 and the opening 112*a* can be appropriately controlled in advance.

Here, the metal conductive surrounding structure 108 is combined with the solder layer 112, constructing a space above the surface acoustic wave members 102 and protecting the surface acoustic wave members 102 effectively.

Figure 3A:
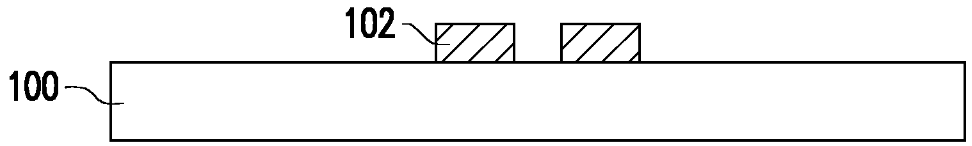
FIG. 3A to FIG. 3C are schematic cross-sectional views of a fabricating process of a surface acoustic wave device according to an embodiment of the present disclosure.
Figure 3B:
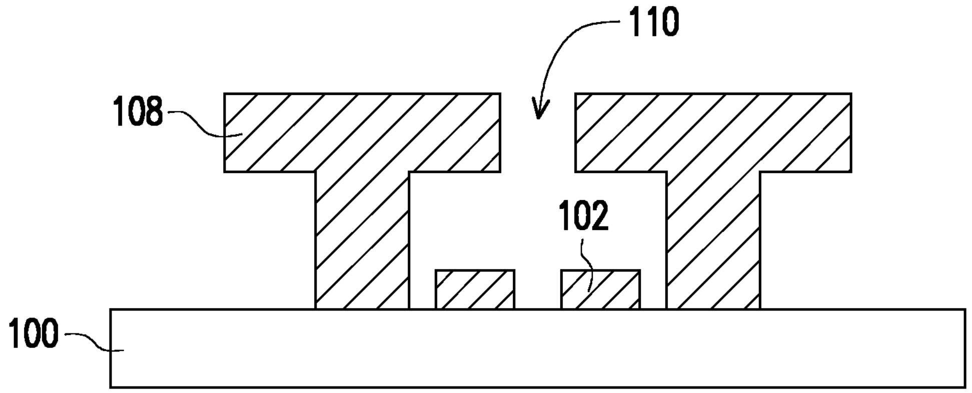
Figure 3C:
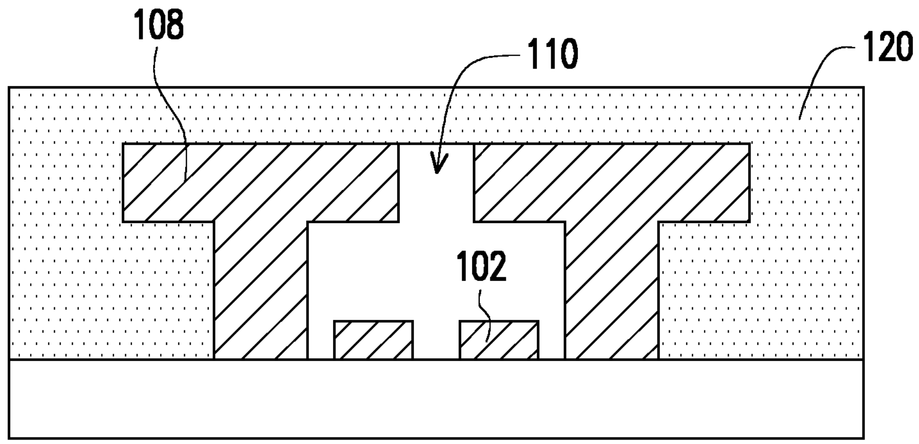

FIG. 3A to FIG. 3C are schematic cross-sectional views of a fabricating process of a surface acoustic wave device according to an embodiment of the present disclosure. In FIG. 3A, as it is shown in FIG. 2A, a plurality of surface acoustic wave members 102 are first formed on a substrate 100.

In FIG. 3B, adopting the fabricating process shown in FIG. 2B and FIG. 2C, a conductive surrounding structure 108 is formed on the substrate 100 first, and then a sacrificial layer 104 is removed. The surface acoustic wave members 102 are exposed in this structural state.

In FIG. 3C, in an embodiment, for example, a packaging process is adopted to cover a molded plastic structure 120 on the conductive surrounding structure 108, and the process includes covering the top of the conductive surrounding structure 108 and also covering the outer sidewall of the conductive surrounding structure 108, whose bottom is on the substrate 100. The molded plastic structure 120 may also be regarded as a cap structure, which closes the opening 110 of the lateral layer part 108*b* of the conductive surrounding structure 108 to achieve a more comprehensive protection.

The present disclosure proposes that the fabricating method of the surface acoustic wave device allows the use of metal materials to form a protective structure to protect the surface acoustic wave member, which at least meet the requirements of preventing oxidation effectively.

Lastly, the above embodiments are only used to illustrate the technical solutions of the disclosure without limiting the disclosure; although the disclosure has been described in detail with reference to the foregoing embodiments, those of ordinary skill in the art should understand that they may still recombine or modify the technical solutions described in each of the foregoing embodiments, or substitute some or all of the technical features with their equivalence; and the entities of those corresponding technical solutions with such combinations, modifications, or substitutions do not deviate from the scope of the technical solutions of the embodiments of the disclosure.

What is claimed is:

1. A surface acoustic wave device, comprising:
a substrate;
a plurality of surface acoustic wave members, disposed on the substrate;
a conductive surrounding structure, comprising:
a wall part, disposed on the substrate and surrounding the surface acoustic wave members; and
a lateral layer part, disposed on the wall part, wherein the lateral layer part comprises an opening above the surface acoustic wave members; and
a cap layer, adapted to cover the lateral layer part and close the opening.

2. The surface acoustic wave device according to claim 1 wherein the cap layer is a solder layer.

3. The surface acoustic wave device according to claim 2, wherein the cap layer is only on top of the lateral layer part.

4. The surface acoustic wave device according to claim 2, wherein the cap layer is a reflow solder layer adapted for closing the opening of the lateral layer part.

5. The surface acoustic wave device according to claim 1, wherein the conductive surrounding structure is metal, and the cap layer is solder.

6. The surface acoustic wave device according to claim 5, wherein the conductive surrounding structure comprises copper or electroplating material.

7. The surface acoustic wave device according to claim 1, wherein the cap layer is a molded plastic structure.

8. The surface acoustic wave device according to claim 7, wherein the molded plastic structure also covers an outer sidewall of the conductive surrounding structure and is provided on the substrate.

9. The surface acoustic wave device according to claim 7, wherein the cap layer is an epoxy resin cap and closes the opening of the lateral layer part.

10. The surface acoustic wave device according to claim 1, wherein the conductive surrounding structure is metal, and the cap layer is epoxy resin material.

11. The surface acoustic wave device according to claim 10, wherein the conductive surrounding structure comprises copper or electroplating material.

* * * * *